United States Patent [19]

D'Arrigo et al.

[11] Patent Number: 4,823,318

[45] Date of Patent: Apr. 18, 1989

[54] DRIVING CIRCUITRY FOR EEPROM MEMORY CELL

[75] Inventors: Sebastiano D'Arrigo, Houston, Tex.; Giuliano Imondi, Rieti, Italy; Sung-Wei Lin, Houston; Manzur Gill, Rosharon, both of Tex.

[73] Assignee: Texas Instruments Incorporated, Dallas, Tex.

[21] Appl. No.: 239,877

[22] Filed: Sep. 2, 1988

[51] Int. Cl.$^4$ .................. G11C 11/84; G11C 7/00
[52] U.S. Cl. .................................. 365/189; 365/185; 365/218
[58] Field of Search .............. 365/185, 189, 181, 218, 365/94

[56] References Cited

U.S. PATENT DOCUMENTS 4,720,816 1/1988 Matsuoka et al. .................. 365/189
4,761,764 8/1988 Watanabe ............................ 365/185

Primary Examiner—Terrell W. Fears
Assistant Examiner—Melissa J. Koval
Attorney, Agent, or Firm—Theodore D. Lindgren

[57] ABSTRACT

A circuit for applying reading, programming and erasing voltages to a wordline in a floating-gate-type EEPROM cell array comprising four P-channel transistors and two N-channel transistors as well as four switches. The circuit comprises a two-transistor inverter with a feedback transistor and three isolating transistors that prevent excessive currents and voltages from damaging internal and external circuit components.

19 Claims, 1 Drawing Sheet

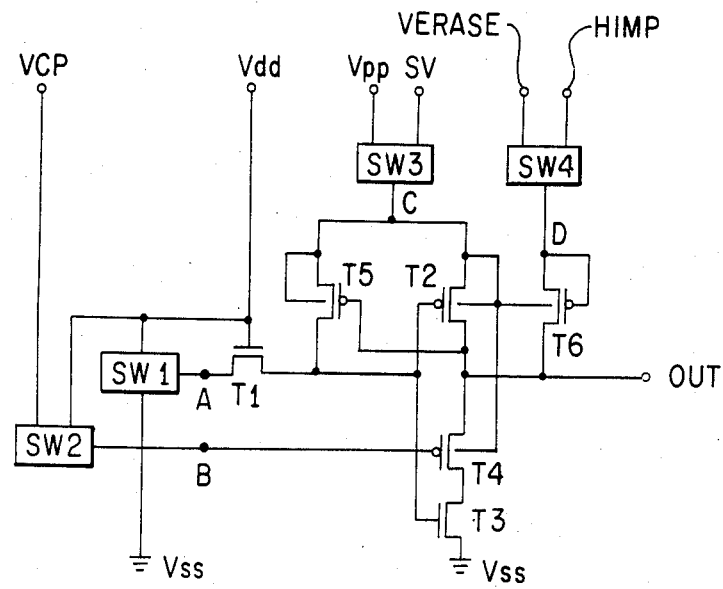

DRIVING CIRCUITRY FOR EEPROM MEMORY CELL

BACKGROUND OF THE INVENTION

This invention relates to a circuit for applying reading, programming and erasing voltages to the programming gates of individual memory cells of floating-gate-type, electrically-erasable-programmable-read-only-memory (EEPROM) arrays.

An EEPROM cell of the type used with the circuitry of this invention is described in our co-pending U.S. patent application Ser. No. 07/056,196, filed June 6, 1987 and also assigned to Texas Instruments Incorporated.

The EEPROM cell of the foregoing Application has a tunnelling area between the floating gate and the source and is programmed with a voltage Vpp of perhaps +12 to +16 volts applied between the control gate and the source, with the source at 0 volts and with the drain allowed to float or tied to a low or reference voltage source. The programming voltage is typically applied for a period of 10 milliseconds and produces a shift in voltage threshold of approximately 4.5 volts or more. The EEPROM cell is erased with a voltage of perhaps −10 to −12 volts applied to the control gate, with the source at perhaps +4 to +6 volts and with the drain allowed to float or tied to a low or reference voltage source. The erasing voltages are typically applied for a period of 10 milliseconds and produce a voltage threshold of approximately 1.0 volt. During reading operation of the EEPROM cell, a voltage of perhaps +3 volts is applied to the control gate with the source at 0 volts and the drain at a read voltage of perhaps 1.5 volts.

In the EEPROM device of the foregoing application, the various supply voltage sources are generated from the one approximately 5-volt external supply voltage using charge-pump capacitors or other type voltage generators located on the memory chip. Circuits for switching from one voltage to one other voltage are well-known and such circuits are used to switch the bitline voltage from one value to another value when changing from the programming mode of operation to the erasing mode of operation, for example. However, there is a need for a circuit that will allow the wordline voltage to be switched among at least three values, a positive programming voltage level, a negative erasing voltage level, and an intermediate sense voltage level.

SUMMARY OF THE INVENTION

The circuit of this invention comprises four P-channel transistors, two N-channel transistors, and a number of prior-art switching circuits connected in a manner that permits application of programming, erasing and reading voltages to a wordline and its associated control gates in an EEPROM cell array. Specifically, the circuit includes a two-transistor inverter with a feedback transistor and three isolating transistors that prevent excessive currents and voltages from damaging internal and external circuit components.

BRIEF DESCRIPTION OF THE DRAWINGS

The novel features of this invention are set forth in the appended claims. The invention, its features, and its advantages are described below in conjunction with the following drawing:

FIG. 1 is a schematic diagram of the circuit of this invention.

DETAILED DESCRIPTION OF THE SPECIFIC EMBODIMENT

Referring to FIG. 1, a circuit is shown with a first signal input terminal A. Terminal A is connected by prior-art switch SW1 to a voltage source which is low (usually Vss or 0 volts) during programming and reading modes of operation and is connected to a higher-value voltage source (perhaps external supply voltage Vdd or +4 to +6 volts) during erasing mode of operation of the circuit. Second signal input terminal B is connected by prior-art switch SW2 to a signalling voltage source VCP, which is negative (perhaps −3 to −5 volts), during reading and programming modes of operation and is connected to a higher value positive voltage source (perhaps Vdd or +4 to +6 volts) during erasing mode of operation. Terminal C of the circuit of FIG. 1 is connected by prior-art switch SW3 to positive supply voltage Vpp (perhaps +12 to +16 volts) during programming mode of operation and to positive supply voltage SV (perhaps +3 volts) during reading and erasing modes of operation. Terminal D of the circuit is connected by prior-art switch SW4 to a negative supply voltage VERASE (perhaps −12 to −14 volts) during erasing mode of operation and is connected to a high impedance HIMP during programming and reading modes of operation. The terminal designated OUT is connected to a wordline with associated control gates in a floating-gate-type EEPROM array. The length of the programming and erasing pulses are provided by a timer circuit integrated in the memory chip and included in sources Vpp and VERASE as defined in this description.

The circuit of FIG. 1 is comprised in part of N-channel first isolating transistor T1 with source-drain path connected between first signal input terminal A and an inverter input terminal and with gate connected to external supply voltage source Vdd. P-channel transistor T2 and N-channel transistor T3 comprise an inverter transistor pair with source-drain paths connected in series between programming/sense voltage source Vpp/SV (terminal C) and ground and with gates connected to the inverter input terminal. P-channel second isolating transistor T4 is connected with source-drain path in series between transistors T2 and T3 and with gate connected to second signal input terminal B. The tanks of transistors T2 and T4 are connected through switch SW3 to programming/sense voltage source Vpp/SV. The output terminal OUT of the circuit is connected to the common source-drain terminal of transistors T2 and T4. p-channel feedback transistor T5 is connected with source-drain path between source Vpp/SV and the inverter input terminal and with gate connected to terminal OUT. The tank of feedback transistor T5 is connected by switch SW3 to source Vpp/SV. P-channel third isolating transistor T6 is connected with source-drain path between terminal D and terminal OUT and with gate connected to terminal D, which is connected to erasing voltage source/ high impedance comprising switch SW4 with negative supply VERASE and with high impedance HIMP. The tank of transistor T6 is connected by switch SW3 to voltage supply Vpp/SV.

During programming, or writing, mode of operation of the circuit of FIG. 1, the voltage applied by switch SW1 to first signal input terminal A is low (0 volts, for example) and therefore transistor T is non-conductive and transistor T2 is conductive. Transistor T6 is nonconductive because terminal D is connected by switch SW4 to high impedance HIMP. Because source Vpp is active for those circuits connected to selected wordlines, the voltage at the terminal OUT (the voltage on the selected wordline and control gate) will be equal to Vpp. For non-selected wordlines, the voltage VCP applied by switch SW2 to second signal input terminal B is active (−4 volts, for example) and the voltage applied by switch SWI to first signal input terminal A is high (+5 volts, for example). Transistor T2 will be nonconductive, transistors T4 and T3 will be conductive and the voltage at the terminal OUT connected to the non-selected wordline will be Vss, or reference voltage.

During erasing mode of operation of the circuit, the voltage applied by switch SWI to the first signal input terminal A is high (+5 volts, for example) and therefore transistor T2 is nonconductive. Transistor T4 is also nonconductive because of the voltage VCP applied by switch SW2 at second signal input terminal B is high (+5 volts, for example) and is applied to the gate of transistor T4. Because the voltage VERASE applied by switch SW4 to terminal D is active (−12 to −14 vols, for example) for a circuit connected to a selected wordline, the voltage at the terminal OUT connected to the wordline and control gate of the selected memory cell will be equal to the same −12 to −14 volts less a small voltage drop across transistor T6. Because the terminal D for a circuit connected to a non-selected wordline is connected by switch SW4 to high impedance HIMP, transistor T2 is nonconductive and transistors T4 and T3 are conductive, causing the voltage at the terminal OUT connected to the wordline and control gate of the non-selected wordline to be equal to Vss, or reference voltage.

During reading mode of operation of the circuit, the voltage applied by switch SW1 to first signal input terminal A is low (0 volts, for example) and, therefore, transistors T3 and T2 are as described in the programming operation. Because the voltage applied to terminal C by switch SW3 is equal to SV rather than Vpp, the voltage at the terminal OUT connected to the wordline and control gate of the selected memory cell will be equal to SV (+3 volts, for example). Because the connections to terminals D and B are the same as described above, the voltage at the terminal OUT connected to the wordline and control gate of a non-selected memory cell will be equal to Vss, or reference voltage.

First isolating transistor T1 serves to prevent the high-magnitude voltages in the circuit from reaching the circuitry attached to switch SW1. Second isolating transistor T4 serves to isolate transistor T3 from negative supply voltage VERASE during the erasing mode of operation of the circuit. Third isolating transistor T6 protects the circuit by allowing current from source VERASE to flow in one direction only.

The programming voltage source Vpp, the erasing voltage source VERASE, the sense voltage source SV and the negative signalling voltage source VCP may be generated on the memory chip from the external supply voltage using charge-pumped capacitors in accordance with prior-art circuits for such voltage sources.

While this invention has been described with respect to a illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A circuit for applying reading, programming and erasing voltages to a wordline in a floating-gate-type EEPROM cell array comprising:
   a first isolating transistor of a first type with source drain path connected between a first signal input terminal and an inverter input terminal and with gate connected to an external supply voltage source;
   an inverter transistor pair having a first type transistor and a second type transistor with source-drain paths connected in series between a programming-/sense voltage source and a reference potential and with gates connected to said inverter input terminal, said source-drain path and the tank of said second type transistor connected to said programming/sense voltage source;
   a second isolating transistor of a second type with source-drain path connected in series between said transistors of said inverter transistor pair, with gate connected to a second signal input terminal, and with tank connected to said programming/sense voltage source;
   a feedback transistor of a second type with source-drain path connected between said programming-/sense voltage source and said inverter input terminal, with gate connected to the common source-drain terminal of said second-type inverter transistor and said second isolating transistor, and with tank connected to said programming/sense voltage source; and
   a third isolating transistor of a second type with source-drain path connected between an erasing voltage source/high impedance and said common source-drain terminal of said second-type inverter transistor and said second isolating transistor, with gate connected to said erasing voltage source/high impedance, and with tank connected to said programming/sense voltage source;
   wherein the output of said circuit is connected to said common source-drain terminal of said second-type inverter transistor and said second isolating transistor.

2. The circuit of claim 1 in which said first transistor type is N-channel and said second transistor type is P-channel.

3. The circuit of claim 1 including a first switch for connecting one of said external supply voltage and said reference potential to said first signal input terminal.

4. The circuit of claim 1 including a second switch for connecting one of said external supply voltage and a signalling supply voltage to said second signal input terminal.

5. The circuit of claim 1 including a signalling supply voltage source connected to said second signal input terminal, wherein said signalling supply voltage source comprises a charge-pumped capacitor.

6. The circuit of claim 1 in which said programming-/sense voltage source includes a third switch and a voltage source for programming mode of operation and voltage source for reading mode of operation.

7. The circuit of claim 1 in which said programming-/sense voltage source includes a first voltage source for programming mode of operation, said first voltage source comprising a charge-pumped capacitor.

8. The circuit of claim 1 in which said programming/sense voltage source includes a second voltage source for reading mode of operation, said second voltage source comprising a charge-pumped capacitor.

9. The circuit of claim 1 in which said erasing voltage source/high impedance includes a fourth switch for connecting one of a negative erasing voltage source and a high impedance to said third isolating transistor.

10. The circuit of claim 1 in which said erasing voltage source/high impedance includes a negative voltage source comprising a charge-pumped capacitor.

11. A circuit for applying programming, erasing and reading voltages to a wordline in a floating-gate-type EEPROM array comprising:
 a N-channel first isolating transistor with source-drain path connected between a first signal input terminal and an inverter input terminal and with gate connected to a supply voltage source;
 an inverter including a P-channel inverter transistor, a P-channel second isolating transistor and a N-channel inverter transistor with source-drain paths connected in series between a programming/sense voltage source and a reference potential and including a P-channel feedback transistor with source-drain path connected between said programming/sense voltage source and said inverter input terminal, wherein the gates of said inverter transistors are connected to said inverter input terminal, the gate of said second isolating transistor is connected to a second signal input terminal and the gate of said feedback transistor is connected to the output of said circuit, and wherein the tanks of said P-channel transistors are connected to said programming/sense voltage source;
 a P-channel third isolating transistor with source-drain path connected between an erasing voltage/high impedance and said output of said circuit and with tank connected to said programming/sense voltage source;
 wherein said output of said circuit is connected to said common source-drain terminal of said P-channel inverter transistor and said second isolation transistor.

12. The circuit of claim 11 including a first switch for connecting on of said supply voltage and said reference potential to said first signal input terminal.

13. The circuit of claim 11 including a second switch for connecting one of said supply voltage and a signalling supply voltage to said second signal input terminal.

14. The circuit of claim 11 including a signalling supply voltage source connected to said second signal input terminal, wherein said signalling supply voltage source comprises a charge-pumped capacitor.

15. The circuit of claim 11 in which said programming/sense voltage source includes a third switch and a voltage source for programming mode of operation and a voltage source for reading mode of operation.

16. The circuit of claim 11 in which said programming/sense voltage source includes a first voltage source for programming mode of operation, said first voltage source comprising a charge-coupled capacitor.

17. The circuit of claim 11 in which said programming/sense voltage source includes a second voltage source for reading mode of operation, said second voltage source comprising a charge-pumped capacitor.

18. The circuit of claim 11 in which said erasing voltage source/high impedance includes a fourth switch for connecting on of a negative erasing voltage source and a high impedance to said third isolating transistor.

19. The circuit of claim 11 in which said erasing voltage source/high impedance includes a negative voltage source comprising a charge-pumped capacitor.

* * * * *